United States Patent [19]

Chen et al.

[11] Patent Number: 5,369,302
[45] Date of Patent: Nov. 29, 1994

[54] METHOD TO IMPROVE STEP COVERAGE BY CONTACT REFLOW

[75] Inventors: Fusen E. Chen, Milpitas, Calif.; Girish A. Dixit, Dallas, Tex.

[73] Assignee: SGS-Thomson Microelectronics, Inc., Carrollton, Tex.

[21] Appl. No.: 840,679

[22] Filed: Feb. 21, 1992

Related U.S. Application Data

[63] Continuation of Ser. No. 601,286, Oct. 22, 1990, abandoned.

[51] Int. Cl.⁵ .................................. H01L 21/90
[52] U.S. Cl. ......................... 257/734; 257/754; 257/768; 257/770; 257/773; 257/776
[58] Field of Search ................ 357/71, 715, 68; 257/530, 2, , 734, 754, 768, 770, 773, 776; 437/194, 200

[56] References Cited

U.S. PATENT DOCUMENTS

| | | | |
|---|---|---|---|
| 4,361,599 | 11/1982 | Wourms | 357/71 S |
| 4,381,215 | 4/1983 | Reynolds et al. | 357/71 S |
| 4,458,410 | 7/1984 | Sugaki et al. | 357/71 S |
| 4,502,209 | 3/1985 | Eizenberg et al. | 357/71 |
| 4,680,612 | 7/1987 | Hieber et al. | 357/71 S |
| 4,700,465 | 10/1987 | Sirkin | 357/71 R |
| 4,748,490 | 5/1988 | Hollingsworth | 257/530 |
| 4,752,813 | 6/1988 | Bhatia et al. | 357/71 R |
| 4,772,571 | 9/1988 | Scovell et al. | 357/71 S |
| 4,807,016 | 2/1989 | Douglas | 357/71 |
| 4,816,879 | 3/1989 | Ellwanger | 357/71 |
| 4,897,709 | 1/1990 | Yokoyama et al. | 357/71 R |
| 4,926,237 | 5/1990 | Sun et al. | 357/71 |
| 4,962,414 | 10/1990 | Liou et al. | 357/71 |
| 4,966,868 | 10/1990 | Murali et al. | 437/200 |
| 5,006,916 | 4/1991 | Wills | 351/71 |
| 5,049,975 | 9/1991 | Ajika et al. | 437/192 |
| 5,094,981 | 3/1992 | Chung et al. | 437/194 |

FOREIGN PATENT DOCUMENTS 60-182771 9/1985 Japan.
1-230269 9/1989 Japan.

OTHER PUBLICATIONS

"Multiple Metal Film Structures for Wiring VLSI Circuit Chips", IBM, vol. 33, No. 1A, Jun. 1990, pp. 15-16.

*Primary Examiner*—Viet Q. Nguyen
*Attorney, Agent, or Firm*—Lisa K. Jorgenson; Kenneth C. Hill; Richard K. Robinson

[57] ABSTRACT

The method for fabrication of semiconductor contacts resulting in rounded contact corners providing for increased step coverage includes depositing a glass layer over a substrate and heating the glass layer to reflow. The glass layer is patterned and etched to form a contact opening. A barrier layer is deposited, annealed, and selectively wet etched leaving the barrier layer only in the bottom of the contact opening. The glass layer is reflowed again to form rounded contact corners.

8 Claims, 2 Drawing Sheets

METHOD TO IMPROVE STEP COVERAGE BY CONTACT REFLOW

This application is a continuation of application Ser. No. 07/601,286, filed Oct. 22, 1990 now abandoned.

TECHNICAL FIELD

The present invention relates generally to semiconductor integrated circuit processing, and more specifically to improving step coverages for contacts and vias.

BACKGROUND OF THE INVENTION

Metal step coverage has been of prime importance throughout the history of integrated circuit (IC) manufacture. Step coverage, however, has still been a major problem for IC manufacturers even into the late 1980s. Poor step coverage can be found at the sharp vertical step metal to substrate contacts, metal to metal vias, and metal crossovers. As dimensions shrink, conventional techniques of producing sloped contacts and vias to improve step coverage fall short of expectations and are limited to stringent design criteria.

One method of improving step coverage has been realized through the use of thermal processing. Contact openings are cut using known dry etching processes. The sharp corners of the contacts resulting from the contact etch are rounded off by thermal processing at high temperatures. With the effect of surface tension, at temperatures close to melting point temperatures, almost all of the known insulating materials through which contact openings are formed tend to bead up eliminating sharp corners and reducing surface area. This reduction in surface area with no reduction in volume is a more thermodynamically stable arrangement.

The direct application, however, of thermal processing has certain disadvantages. For example, in the case of a metal contact, the contact resistance between metal and substrate is often reduced by the use of a suitable implant in the substrate. Thermal processing tends to nullify the effects of an implant because at melting point temperatures of reflow glass, the implanted species tend to diffuse out of the substrate and into the atmosphere before the metal layer is deposited. When such diffusion in the atmosphere occurs, a number of special implantation steps, according to the specific type of technology employed, may have to be added after thermal processing to achieve the desired contact resistance between metal and substrate.

It would be desirable for a semiconductor process to minimize step coverage problems in contacts and vias. It would further be desirable for such fabrication technique to provide sloped contact corners suitable for use with small device geometries.

SUMMARY OF THE INVENTION

It is therefore an object of the present invention to provide a semiconductor fabrication technique which minimizes step coverage problems in contacts and vias.

It is a further object of the present invention to provide such a semiconductor fabrication process for making sloped contact corners which is suitable for use with small device geometries.

It is yet another object of the present invention to provide such a semiconductor fabrication process which is easily adapted for use with standard integrated circuit fabrication process flows.

Therefore, according to the present invention, after forming a glass insulating layer over a substrate and reflowing such glass layer, the glass layer is etched using an anisotropic etch to form contact openings. Selected portions of the integrated circuit are exposed in such openings. A conductive barrier layer is formed over the glass layer and exposed portions of the integrated circuit, annealed, and selectively etched so that the barrier layer remains only on the exposed portion of the integrated circuit. The glass insulating layer is reflowed again to form rounded contact corners.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. FIGS. 1–6 represent a cross-section of a portion of an integrated circuit during fabrication. The figures are not drawn to scale, but instead are drawn so as to illustrate the important features of the invention.

Figure 1:
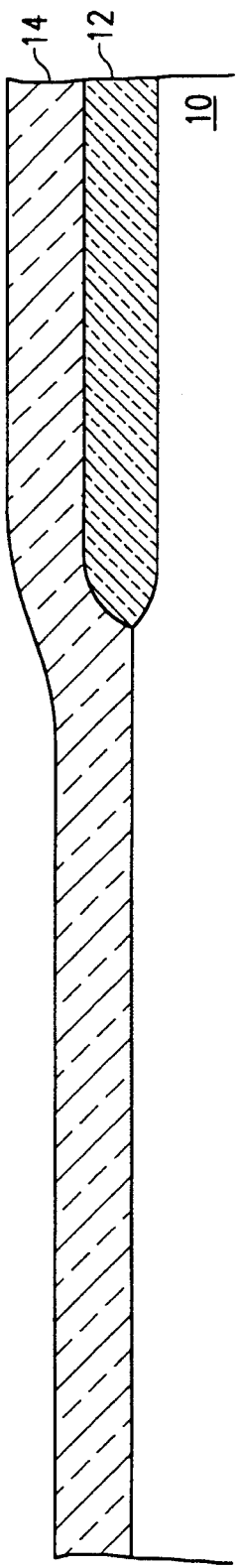
FIGS. 1–6 illustrate a preferred process flow according to the present invention.

Referring to FIG. 1, an integrated circuit is to be formed in a silicon substrate 10. Selected regions of the substrate 10 are oxidized to form a field oxide 12 as known in the art. Active devices are formed in those portions of the substrate 10 not covered by field oxide 12. An insulating layer 14 of boro-phosphosilicate glass (BPSG) or phospho-silicate glass (PSG) is deposited over the entire surface of the chip. A thermal heat process is used causing the BPSG or PSG to become soft enough to flow and smooth out over the surface of the wafer.

Figure 2:
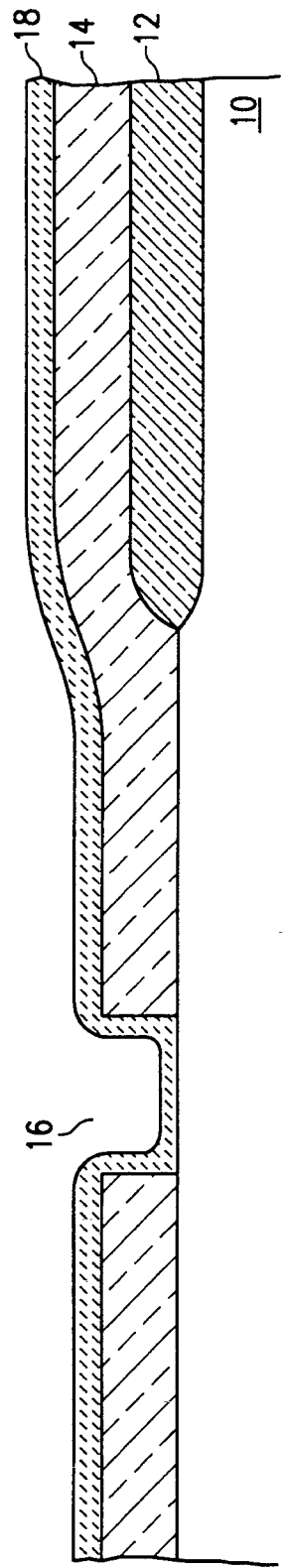

Referring to FIG. 2, the integrated circuit is then patterned and etched using an anisotropic plasma etch to form contact opening 16. A refractory metal barrier layer 18, such as titanium, is deposited over the glass insulating layer 14.

Figure 3:
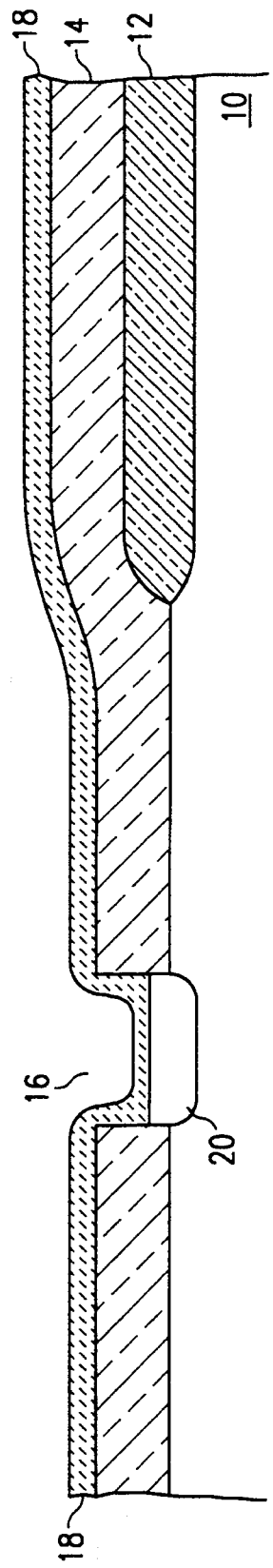

Referring to FIG. 3, the titanium is annealed in a nitrogen ambient by rapid thermal annealing (RTA) or furnace annealing, heating the wafer uniformly. In the bottom of the contact opening, the titanium reacts with the underlying lightly doped substrate 10 to form a titanium disilicide (TiSi$_2$) barrier layer 20. The use of the RTA process to form TiSi$_2$ drives the dopant further down into the substrate reducing the possibility of outdiffusion or outgassing into the atmosphere. This outdiffusion is further reduced because the dopant has a low diffusivity through the titanium. The remainder of layer 18 reacts with the nitrogen used during RTA to form titanium nitride (TiN).

Figure 4:
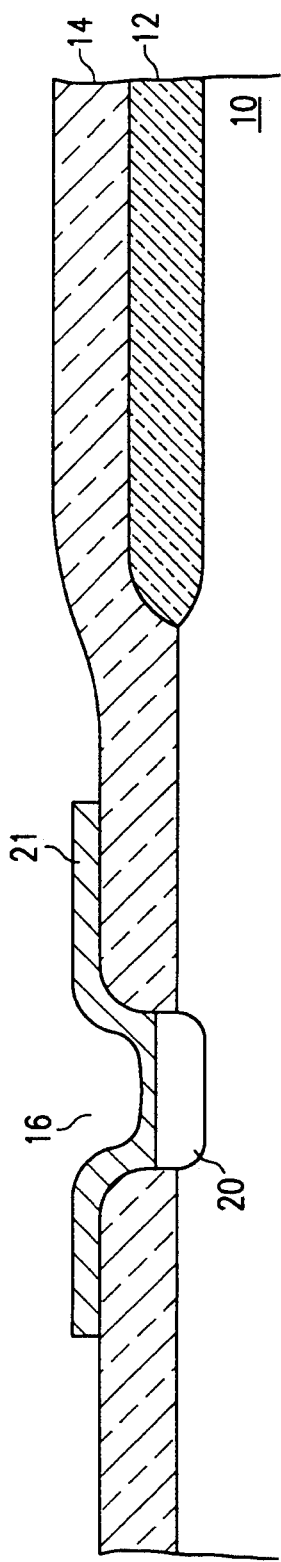

Referring to FIG. 4, the integrated circuit is selectively wet etched using known techniques to remove the TiN layer 18, leaving the TiSi$_2$ barrier layer 20 in the bottom of the contacts. The integrated circuit undergoes the RTA process or furnace reflow to cause the BPSG or PSG to become soft whereby the corners round off to form a smooth surface. The rounded corners result from the surface tension effect in which the BPSG or PSG glass layer tends to bead up at higher temperatures reducing the surface area while maintaining the same volume of glass material. After the RTA process, a metal layer 21 is deposited and patterned by known methods forming a contact.

Figure 5:
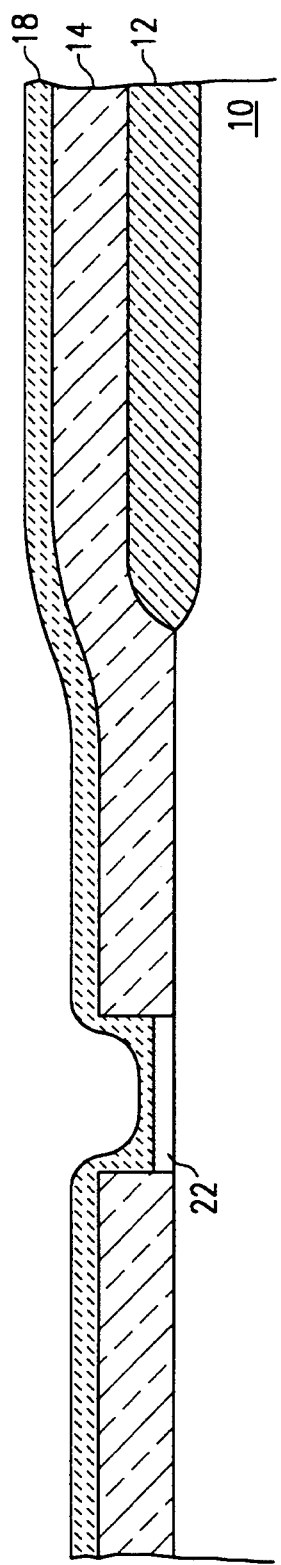
Figure 6:
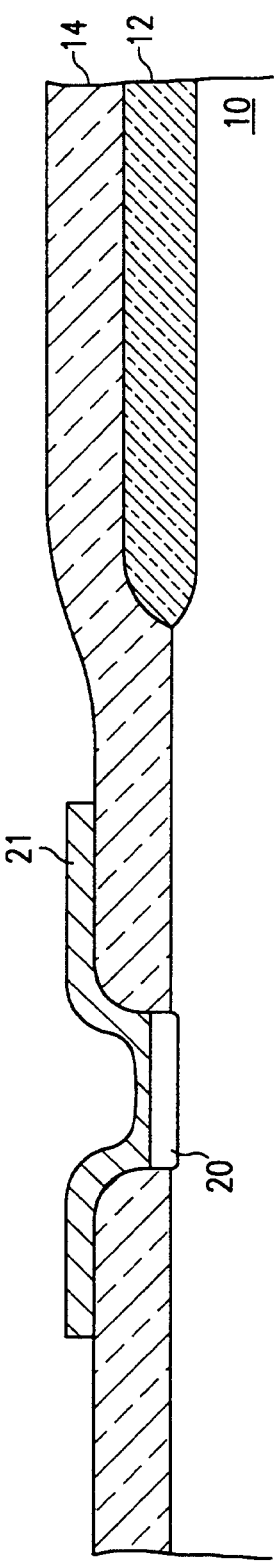

Referring to FIG. 5, an alternative embodiment includes growing a buffer epitaxial silicon layer 22 before the deposition of the refractory metal barrier layer 18. The sequence of process steps is the same as described above after the growth of the epitaxial layer 22. As shown in FIG. 6, growth of the epitaxial layer 22 before the barrier layer 18 reduces the amount of silicon consumed from the substrate during the annealing process of the barrier layer 20 while continuing to prevent the outdiffusion of the dopant in the substrate through the barrier layer. Metal layer 21 is deposited and patterned to form a contact.

An alternative embodiment includes growing the epitaxial layer 22 as above. However, after growing layer 22, the integrated circuit undergoes the RTA process or furnace reflow to round out the corners of the contact. The epitaxial layer prevents the outdiffusion into the atmosphere of dopants in the substrate. A contact is then made in a known manner.

Deposition and patterning of the various layers may be varied to be made consistent with process flows for the devices being fabricated. In a typical embodiment, the BPSG or PSG layer 14 will be deposited to a depth of approximately 4000 to 8000 Angstroms. The refractory metal barrier layer 18 will typically be approximately 200 to 700 Angstroms thick. The epitaxial layer 22, if deposited before the barrier layer 18 will have a thickness of approximately 200 to 700 Angstroms.

The thermal heat and anneal processes and temperatures may also be varied to be made consistent with process flows for the devices being fabricated. In a typical embodiment, the thermal heating of the BPSG or PSG layer 14 after deposition will occur at temperatures of approximately 800 to 1100 degrees Celsius for a period of approximately 20 minutes to 1 hour. The annealing of the refractory metal barrier layer 18 such as titanium will typically occur at temperatures approximately 650 to 800 degrees Celsius. The RTA process of the BPSG or PSG layer after removal of the refractory metal nitride layer 18 through the use of wet chemicals will occur at temperatures approximately 900 to 1100 degrees Celsius for approximately 20 seconds to 1 minute. If furnace reflow of the BPSG or PSG layer is used, the temperature will be approximately 800 to 1000 degrees Celsius for approximately 20 minutes.

One alternative refractory metal that can be deposited is tungsten. Tungsten can be selectively deposited by known methods in the bottom of the contact opening. The tungsten is then annealed to form tungsten disilicide ($WSi_2$) in the bottom of the contact. Because of the selective deposition of tungsten, the resulting structure is the same as described above for titanium, but the wet etch step is not required.

The primary advantage of the present application over the prior art is the prevention of outdiffusion or outgassing of the dopant in the substrate during the RTA or furnace reflow process which rounds the corners of a contact opening. When a refractory metal barrier layer, such as titanium, is deposited over the integrated circuit and then annealed, the metal layer reacts with the silicon substrate forming a silicide ($TiSi_2$) in the bottom of the contact opening. This process pushes the dopant further down into the substrate. Thus, the dopant is farther away from the surface and has a low diffusivity through the refractory metal layer. When RTA of the BPSG or PSG layer is performed the dopant is prevented by the $TiSi_2$ layer from outdiffusing into the atmosphere. The epitaxial layer grown before the refractory metal barrier layer provides the additional advantage of reducing the amount of the silicon consumed from the substrate during the annealing process of the refractory metal layer.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. An electrical contact comprising:
   a substrate having a substantially planar upper surface;
   a glass insulating layer over the substrate and in contact with its upper surface, the insulating layer having a contact opening therethrough having substantially rounded corners, wherein the contact opening and rounded corners have a cross-sectional profile resulting from reflowing a reflowable glass after the opening has been formed;
   a refractory metal silicide barrier layer in the bottom of the contact opening wherein the barrier layer is substantially above the substrate upper surface; and,
   an interconnect over the barrier layer in the bottom of the contact opening and over the insulating layer elsewhere.

2. The electrical contact of claim 1, wherein the refractory metal silicide comprises titanium silicide.

3. The electrical contact of claim 1, wherein the refractory metal silicide comprises tungsten silicide.

4. The electrical contact of claim 1, further comprising:
   a conductive region in the substrate underneath the opening, wherein the conductive region is in contact with the barrier layer, and further wherein the conductive region has an impurity dopant cross-sectional profile characteristic of the barrier layer preventing dopant out-diffusion during a reflowing of the reflowable glass.

5. An electrical contact for an integrated circuit, comprising:
   a semiconductor substrate having a planar upper surface;
   an insulating layer in contact with the substrate upper surface;
   an opening through the insulating layer exposing a portion of the substrate, wherein the opening has a cross-section characteristic of reflowing the insulating layer after the opening has been formed;
   a conductive region, in the exposed portion of the substrate, having an impurity dopant therein, wherein the dopant has a profile characteristic of substantially no diffusion of the dopant out of the substrate through the opening;

a refractory metal silicide barrier region in the opening, positioned substantially above the substrate upper surface; and a patterned conductive interconnect in the opening and covering a portion of the insulating layer.

6. The device of claim 5, wherein the refractory metal is titanium.

7. The device of claim 5, wherein the refractory metal is tungsten.

8. The device of claim 7, wherein the tungsten is selectively deposited in the bottom of the contact opening.

* * * * *